(12) United States Patent
Cho et al.

(10) Patent No.: US 6,562,697 B1
(45) Date of Patent: May 13, 2003

(54) METHODS OF IMPLANTING IONS INTO DIFFERENT ACTIVE AREAS TO PROVIDE ACTIVE AREAS HAVING INCREASED ION CONCENTRATIONS ADJACENT TO ISOLATION STRUCTURES

(75) Inventors: Chang-Hyun Cho, Seoul (KR); Ki-Nam Kim, Kyungki-do (KR); Sang-Hyeon Lee, Kyungki-do (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 10/093,295

(22) Filed: Mar. 7, 2002

(51) Int. Cl.[7] ............................................... H01L 21/76
(52) U.S. Cl. ..................... 438/424; 438/298; 438/296
(58) Field of Search .......................... 438/289, 298, 438/424, 294, 296

(56) References Cited

U.S. PATENT DOCUMENTS

| | | | |
|---|---|---|---|
| 5,057,444 A | | 10/1991 | Fuse et al. |
| 5,960,276 A | | 9/1999 | Liaw et al. |
| 6,245,624 B1 | | 6/2001 | Kim et al. |
| 6,287,921 B1 | * | 9/2001 | Chem ........................ 438/289 |
| 2002/0031890 A1 | * | 3/2002 | Watanabe et al. ........... 438/296 |

FOREIGN PATENT DOCUMENTS

KR  99-61122  7/1997

* cited by examiner

Primary Examiner—Tuan H. Nguyen
(74) Attorney, Agent, or Firm—Myers Bigel Sibley & Sajovec

(57) ABSTRACT

Active areas of integrated circuits can be formed by implanting first ions into a first active area of a substrate adjacent to an isolation structure in the substrate and between a source and a drain region of the integrated circuit to provide a first concentration of ions in the first active area. Second ions are implanted into the first active area and a second active area of the substrate adjacent to the first active area and spaced-apart from the isolation structure on the substrate to provide a second concentration of ions in the second active area and a third concentration of ions in the first active area that is greater than the first and second concentrations. As a result, the level of ion concentration can be higher at the edge of an active channel region than at the center of the channel. The increased concentration of ions in the active area adjacent to the side wall of the trench may reduce a current between the source and drain regions of the transistor when voltage that is less than a threshold voltage of the transistor is applied to the gate electrode of the transistor. Thus, a reduction in the threshold voltage of the transistor can be inhibited. Integrated circuit transistors are also disclosed.

18 Claims, 3 Drawing Sheets

METHODS OF IMPLANTING IONS INTO DIFFERENT ACTIVE AREAS TO PROVIDE ACTIVE AREAS HAVING INCREASED ION CONCENTRATIONS ADJACENT TO ISOLATION STRUCTURES

FIELD OF THE INVENTION

The invention relates to the formation of integrated circuits in general, and ore particularly, to the formation of active areas in integrated circuits.

BACKGROUND OF THE INVENTION

Some conventional methods of forming trench isolation regions include forming a trench region in a substrate and filling the trench with a dielectric layer. In some of these conventional methods, the trench isolation region is formed relatively deep and narrow to increase the density of the integrated circuits in which the trench isolation structure is formed. Trench isolation regions formed using these types of conventional methods can provide good results.

However, some conventionally formed trench isolation regions, such as those described above, can develop an electric field that is concentrated at a border between the trench isolation region and an active region adjacent thereto. In particular, the electric field can develop at an upper side wall of the trench isolation region which can lead to the development of a channel inversion layer at the upper side wall of the trench isolation region (or at the edge of the active region) adjacent to the channel region of a transistor. The channel inversion layer can cause a leakage current at the upper side wall of the trench isolation region between a source region and a drain region of the transistor when a voltage applied to the gate electrode is less than a threshold voltage of the transistor. This phenomenon is sometimes referred to as an inverse narrow width effect and is further discussed in "Silicon Processing for the VLSI ERA Volume 3" by Stanley Wolf, Lattice Process, pp. 222–226., and in U.S. Pat. Nos. 5,960,276 to Liaw et al. and 5,057,444 to Fuse et al. U.S. Pat. No. 6,245,624 to Kim et al. discusses lightly doped drain regions in integrated circuits.

SUMMARY OF THE INVENTION

Active areas of integrated circuits can be formed according to embodiments of the invention by implanting first ions into a first active area of a substrate adjacent to an isolation structure in the substrate and between a source and a drain region of the integrated circuit to provide a first concentration of ions in the first active area. Second ions are implanted into the first active area and a second active area of the substrate adjacent to the first active area and spaced-apart from the isolation structure on the substrate to provide a second concentration of ions in the second active area and a third concentration of ions in the first active area that is greater than the first and second concentrations. As a result, the level of ion concentration can be higher at the edge of an active channel region than at the center of the channel. The increased concentration of ions in the active area adjacent to the side wall of the trench may reduce a leakage current between the source and drain regions of the transistor when voltage that is less than a threshold voltage of the transistor is applied to the gate electrode of the transistor. Thus, a reduction in the threshold voltage of the transistor can be inhibited.

In transistor devices according to the invention, an isolation structure is located in an integrated circuit substrate. An active region of the substrate is adjacent to the isolation structure, the active area includes a source region of the transistor and a drain region of the transistor having a channel region therebetween. A first active area of the active region is adjacent to the isolation structure and has a first concentration level of ions of a conductivity type. A second active area is in the active region and is separated from the isolation structure by the first active area and has a second concentration level of ions of the conductivity type that is less than the first concentration level of ions.

BRIEF DESCRIPTION OF THE DRAWINGS

FIGS. 1–3A and 4–5 are cross-sectional views that illustrate embodiments of integrated circuits according to the invention.

DETAILED DESCRIPTION OF EMBODIMENTS ACCORDING TO THE INVENTION

Figure 1:
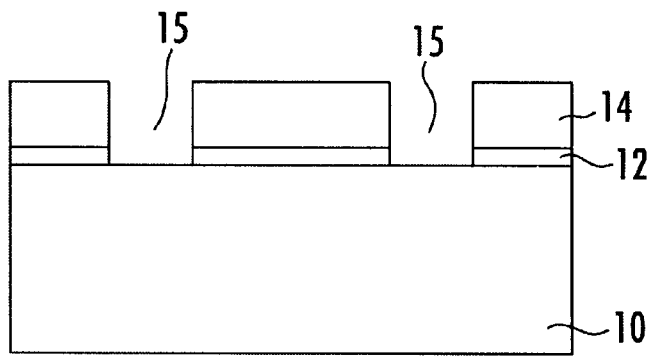

The invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art.

In the drawings, the relative sizes of regions may be exaggerated for clarity. It will be understood that when an element such as a layer, region, portion, or substrate is referred to as being "on" another element, it can be directly on the other element or intervening elements may also be present. In contrast, when an element is referred to as being "directly on" another element, there are no intervening elements present. Moreover, each embodiment described and illustrated herein includes its complementary conductivity type embodiment as well.

It will be understood that when an element such as a layer, region, portion, or substrate is referred to as being on an intervening element and "opposite" another element, the element is separated from the other element by the intervening element. The terms used herein are to be given their ordinary meaning unless explicitly defined otherwise herein.

Embodiments according to the invention can provide active areas of integrated circuits and isolation structures therein by implanting first ions into a first active area of a substrate adjacent to an isolation structure in the substrate to provide a first concentration of ions in the first active area. Second ions are implanted into the first active area and a second active area of the substrate adjacent to the first active area and spaced-apart from the isolation structure on the substrate to provide a second concentration of ions in the second active area and a third concentration of ions in the first active area that is greater than the first and second concentrations.

As a result, the level of ion concentration can be higher at the edge of an active channel region than at the center of the channel. The increased concentration of ions in the active area adjacent to the side wall of the trench may reduce a current between the source and drain regions of the transistor when voltage that is less than a threshold voltage of the transistor is applied to the gate electrode of the transistor. Thus, a reduction in the threshold voltage of the transistor can be inhibited.

FIGS. 1–7B are cross-sectional views and plan views that illustrate embodiments of transistors formed according to the invention. Referring to FIG. 1, an oxide layer and an etch stop layer are formed on an integrated circuit substrate 10. Using photolithography and an etching process, the oxide layer and the etch stop layer are patterned to form an oxide pattern 12 and etch stop pattern 14 having openings 15 therein that expose underlying portions of the substrate 10. In some embodiments according to the invention, the oxide pattern 12 is formed of a thermal oxide material to a thickness in a range between about a few ten of Ångstroms to about a few hundred Ångstroms. In some embodiments according to the invention, the etch stop pattern 14 is formed of silicon nitride ($Si_3N_4$) to a thickness in a range between about 500 Ångstroms to about 2000 Ångstroms.

Figure 2:
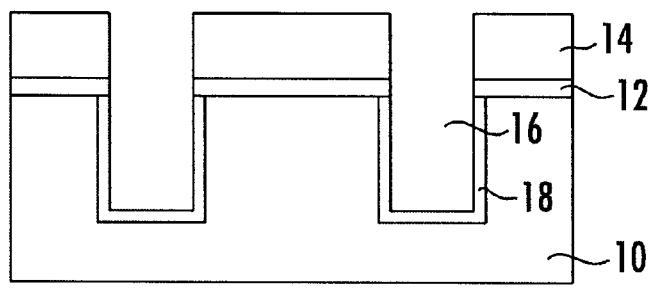

Referring to FIG. 2, recesses 16 are formed in the substrate 10 through the openings 15. Recess oxide layers 18 are formed on the side walls and the bottoms of the recesses 16 using thermal oxidation. In particular, the recesses 16 are formed by etching the substrate 10 to a depth of about a few thousand Ångstroms using the etch stop pattern 14 as a mask. In some embodiments according to the invention, the recesses 16 are etched to a depth of about 2500 Ångstroms. In general, the recess oxide layers 18 are formed to a thickness in range between about a few tens of Ångstroms to about a few hundreds of Ångstroms. Although not shown in FIG. 2, silicon nitride linings may be formed on the recess oxide layers 18 to a thickness in a range between about a few tens of Ångstroms to about a few hundreds of Ångstroms. The recess oxide layers 18 are formed to compensate for damage to the crystalline structure of the side walls caused by the etching.

Figure 3A:
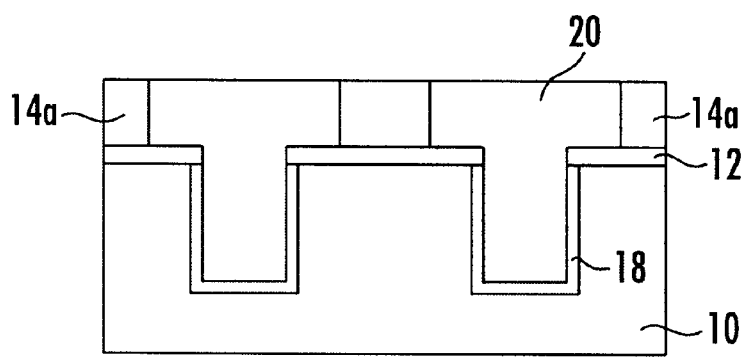

Referring to FIG. 3A, the side walls of the etch stop pattern 14 are etched back to expose an area of the surface of the substrate 10 that is adjacent to the side wall of the recess 16. A portion of the etch stop pattern 14 which is beyond the exposed surface of the substrate 10 is not removed by the etching back of the side walls to, thereby, form an ion implantation mask layer 14a for use during a subsequent ion implantation process. In some embodiments according to the invention, the etch stop layer 14 is etched back a distance from the side wall of the recess 16 in a range between about a few tens of Ångstroms and about a few hundred Ångstroms. For example, the etch stop layer 14 can be etched back a distance from the side wall of the recess 16 in a range between about 20 Ångstroms and about 200 Ångstroms.

In some embodiments according to the invention, the etch stop layer 14 is isotropically etched using, for example, a wet etch with phosphoric acid. Thus, the thickness of the etch stop layer 14 can be reduced while being etched back from the side wall of the recess 16 by the isotropic etching.

As shown in FIG. 3A, an oxide layer 20 is formed in the recess 16 and on the exposed area of the substrate 10 that is adjacent to the recess 16 side wall and on the ion implantation mask 14a. In some embodiments according to the invention, the oxide layer 20 is formed using Chemical Vapor Deposition (CVD). The resulting structure is planarized by Chemical-Mechanical Polishing to expose the ion implantation mask 14a. In some embodiments according to the invention, the planarization reduces the ion implantation mask 14a to a thickness in a range between about 50 Ångstroms and about 300 Ångstroms using a phosphoric acid solution having an etching selectivity for the nitride (etch stop) pattern 14 over the oxide pattern 12. In some embodiments according to the invention, a high-density plasma oxide layer is used as the oxide layer 20.

Figure 3B:
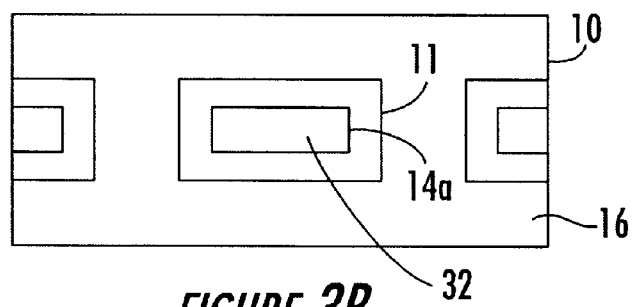
FIG. 3b is a plan view that illustrates embodiments of intermediate structures according to the invention.

FIG. 3B is a plan view of the structure shown in FIG. 3A having an ion implantation mask layer 14a formed thereon for use during a subsequent ion implantation. The ion implantation mask layer 14a is formed by etching a portion of the etch stop pattern 14 on the active region 11.

Figure 4:
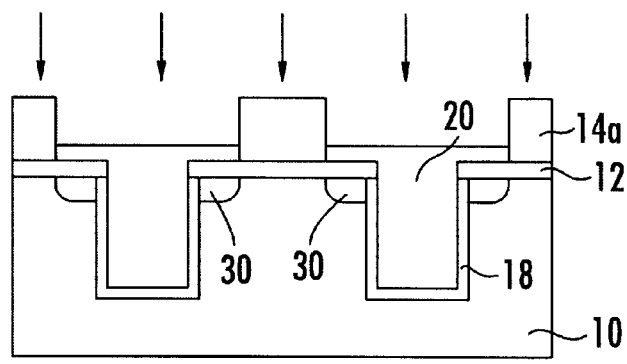

Referring to FIG. 4, a portion of the oxide layer 20 is removed to reduce the surface of the oxide layer 20 to a level that is below the surface of the ion implantation mask 14a and above the surface of the substrate 10 to form an isolation structure. In some embodiments according to the invention, the oxide layer 20 is reduced to a level above the substrate 10 that is in a range between about 100 Ångstroms and about 500 Ångstroms. In some embodiments according to the invention, a solution of $NH_3+H_2O_2+D.I.$ water, such as HF or SC-1, having an etching selectivity of oxide to nitride is used to etch the oxide layer 20.

As shown in FIG. 4, a first ion implantation is performed through the ion implantation mask 14a to form first active areas 30 having respective first concentrations of ion impurities that are adjacent to the isolation structures discussed above. A second active area in the substrate 10 underlying the ion implantation mask 14a is shielded from the first ion implantation. In some embodiments according to the invention, the first ions are implanted into the first active areas 30 at an angle that is substantially normal to the surface of the substrate 10.

In some method embodiments of forming NMOS transistors according to the invention, the first ion implantation uses an ion dosage in a range between about $10^{12}/cm^2$ to about $4 \times 10^{13}/cm^2$ of B or $BF_2$ ions which are implanted to a depth of in a range between about 1000 Ångstroms and about 2000 Ångstroms. In some method embodiments of forming PMOS transistors according to the invention, the first ion implantation uses an ion dosage in a range between about $10^{12}/cm^2$ to about $4 \times 10^{13}/cm^2$ of As or P ions which are implanted to a depth in a range between about 1000 Ångstroms and about 2000 Ångstroms.

Figure 5:
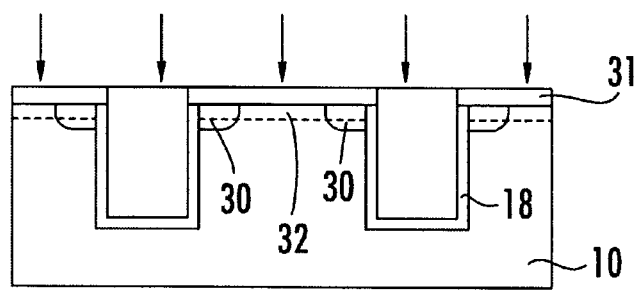

Referring to FIG. 5, the ion implantation mask 14a and the oxide pattern 12 covering the second active region between the isolation structures are removed. The ion implantation mask 14a (of silicon nitride) can be removed by a wet etch using phosphoric acid. In some embodiments according to the invention, the oxide pattern 12 is removed using a solution of $NH_3+H_2O_2+D.I.$ water, such as HF or SC-1.

An ion implantation buffer oxide layer 31 is formed on the substrate 10 to a thickness in a range between about 20 Ångstroms and about 200 Ångstroms. Although not shown, it will be understood that N-type or P-type wells are formed in the substrate 10 according to the type of transistors to be manufactured. For example, in some embodiments of forming NMOS transistors according to the invention, boron ions are implanted to a depth of about 1.5 $\mu$m at a concentration of about $1.5 \times 10^{13}/cm^2$ to form a P-well. The depth and concentration of the well implant may vary depending on the intended characteristics of transistors to be formed.

Second ions are implanted into the first active area 30 of the substrate 10 and into the area that was shielded from the first ion implantation to form a second active area 32 having a second concentration of ion impurities that is spaced apart from the isolation structures by the first active area 30. Accordingly, the first concentrations of ion impurities in the first active areas 30 discussed above are increased to a third concentration that is greater than the first and second concentrations. In some embodiments according to the invention, the second ions are implanted into the second active area 32 at an angle that is substantially normal to the surface.

The depth to which the seconds ions are implanted can help determine the threshold voltage of the transistors and thus may be adjusted to control the characteristics of the transistor. In some embodiments according to the invention, the same type of ions are implanted into the first and second active areas 30 and 32. As a result, the concentration of ion impurities of the first active area 30 is higher than the concentration of impurity ions of the second active area 32.

In the case of NMOS transistors, the implantation of second ions is performed at a dosage in a range between about $10^{11}/cm^2$ and about $10^{13}/cm^2$ of B or $BF_2$ ions which are implanted to a depth in a range between about 1000 Ångstroms and about 2000 Ångstroms. In the case of PMOS transistors, the implantation of second ions is performed at a dosage in a range between about $10^{11}/cm^2$ and about $10^{13}/cm^2$ of As or P ions which are implanted to a depth in a range between about 1000 Ångstroms and about 2000 Ångstroms.

Figure 6:
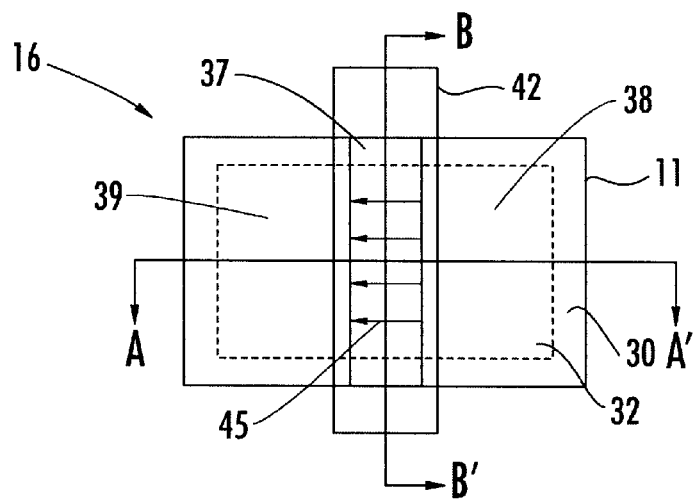
FIG. 6 is a plan view that illustrates embodiments of transistor devices according to the invention.

FIG. 6 is a plan view that illustrates the transistor devices structures shown in FIG. 5 having a gate pattern 42 on an active region 11 which includes the first active area 30 and the second active area 32. According to FIG. 6, the first active area 30 has a third concentration of ion impurities and the second active area 32 has a second concentration of ion impurities that is less than the third concentration. As shown in FIG. 6, the first active area 30 is adjacent to the side wall of the isolation structure 16 and, therefore, surrounds the second active area 32 and separates the second active area 32 from the isolation structure 16. The higher concentration of ions in the first active area 30 may reduce the formation of a channel inversion layer at a location 37 by preventing a reduction the threshold voltage. The location 37 is between the side wall of the isolation structure 16 and a channel region 45 that is between source and drain regions 38, 39 of the transistor.

The concentration of ions in the first active area 30 is greater than the concentration of ions in the channel region 45. For example, in some embodiments of NMOS transistors according to the invention, the location 37 has a $P^+$ doped level and the channel region 45 has a P doped level. The greater concentration of ions at the location 37 relative to the channel region 45 can raise the threshold voltage associated with the location 37 relative to the threshold voltage associated with the channel region 45, thereby reducing the likelihood of a leakage current between the source and drain regions at a boundary between the isolation structure 16 and the location 37.

Figure 7A:
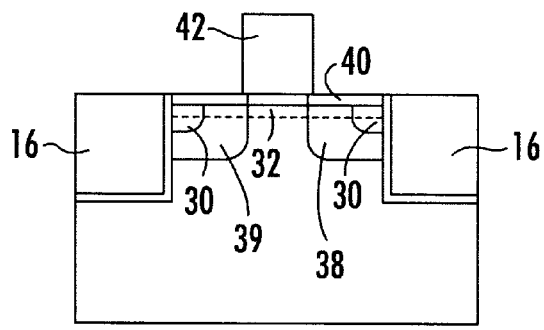
FIGS. 7A and 7B are cross-sectional views that illustrate embodiments of transistors devices according to the invention.
Figure 7B:
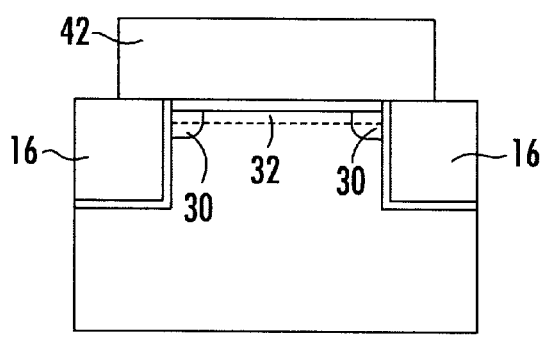

FIGS. 7A and 7B are cross-sectional views that illustrate the gate pattern 42 shown in FIG. 6 taken along lines A–A' and B–B' respectively. The gate pattern 42 includes a gate dielectric layer 40 and a gate electrode on the gate dielectric layer 40 to provide the transistor structure.

As discussed herein, the concentration of ion impurities in a first active area of the substrate adjacent to a side wall of an isolation structure is greater than a concentration in a second active area that is spaced-apart from the isolation structure. Thus, a reduction if the threshold voltage of a transistor due to an inverse narrow width effect can be prevented according to the invention. Also, in a device having a shallow trench isolation (STI) structure, electric fields are concentrated at the edge of the channel region. As a result, an increase in the leakage current can be inhibited.

It should be noted that many variations and modifications can be made to the embodiments described above without substantially departing from the principles of the present invention. All such variations and modifications are intended to be included herein within the scope of the present invention, as set forth in the following claims.

What is claimed:

1. A method of forming integrated circuits having active areas and isolation structures, the method comprising:
    forming a recess in an integrated circuit substrate;
    forming a layer that fills the recess and extends onto the substrate adjacent to a mask on the substrate to provide an isolation structure;
    removing a portion of the layer from an area of the substrate adjacent to the isolation structure and avoiding removing the mask on an active area of the substrate, wherein removing a portion of the layer comprises isotropically etching the layer;
    implanting first ions into the active area using the mask to provide a first concentration of ions in the area adjacent to the isolation structure and between a source region and a drain region of the integrated circuit;
    removing the mask; and
    implanting second ions into the active area to provide a second concentration of ions in the active area and to increase the first concentration to a third concentration of ions in the area of the substrate adjacent to the isolation structure that is greater than the second concentration;
    the method further comprising forming an oxide layer in the recess and on the active area outside the recess and adjacent to the mask; and
    removing a portion of the oxide layer to reduce the oxide layer to a level that is less than a height of the mask.

2. A method according to claim 1 wherein the level is in a range between about 100 Ångstroms and about 500 Ångstroms beyond the surface of the substrate.

3. A method according to claim 1 wherein implanting first ions comprises implanting the first ions normal to a surface of the active area.

4. A method according to claim 3 wherein implanting second ions comprises implanting the second ions at an angle that is substantially normal to the surface of the active area.

5. A method according to claim 1 wherein the first and second ions comprises the same conductivity type ions.

6. A method according to claim 1 wherein the implanting second ions is preceded by:
    implanting ions into the active area to form a well in the substrate.

7. A method according to claim 1 wherein first ions comprise B or $BF_2$ ions, wherein implanting the first ions comprises implanting the first ions to a depth in a range between about 1000 Ångstroms and about 2000 Ångstroms into the first active area and a dose in a range between about $10^{12}$ ions/$cm^2$ to about $4 \times 10^{13}$ ions/$cm^2$.

8. A method according to claim 1 wherein first ions comprise As or P ions, wherein implanting the first ions comprises implanting the first ions to a depth in a range between about 1000 Ångstroms and about 2000 Ångstroms into the first active area and a dose in a range between about $10^{12}$ ions/$cm^2$ to about $4 \times 10^{13}$ ions/$cm^2$.

9. A method according to claim 1 wherein second ions comprise B or $BF_2$ ions, wherein implanting the second ions comprises implanting the second ions to a depth in a range between about 1000 Ångstroms and about 2000 Ångstroms into the first active area and a dose in a range between about $10^{11}$ ions/cm$^2$ to about $10^{13}$ ions/cm$^2$.

10. A method according to claim 1 wherein second ions comprise As or P ions, wherein implanting the second ions comprises implanting the second ions to a depth in a range between about 1000 Ångstroms and about 2000 Ångstroms into the first active area and a dose in a range between about $10^{11}$ ions/cm$^2$ to about $10^{13}$ ions/cm$^2$.

11. A method of forming an integrated circuit comprising:

etching a recess in an integrated circuit substrate through a mask;

etching back a side wall of the mask from an edge of the recess to expose a surface of the substrate outside the recess;

forming an oxide layer in the recess and on the exposed surface of the substrate adjacent to the mask;

etching the oxide layer to a level below a surface of the mask and above a surface of the substrate;

implanting ions of a conductivity type through the oxide layer into the substrate adjacent to the edge of the recess to provide a first active area of the substrate having a first concentration of the ions, wherein the ions are blocked from implantation into a shielded portion of the substrate beneath the mask;

removing the mask to expose the shielded portion; and implanting ions of the conductivity type into the exposed shielded portion to provide a second active area of the substrate having a second concentration of the ions and into the substrate adjacent to the edge of the recess to increase the first concentration to a third concentration of the ions that is greater than the second concentration.

12. A method according to claim 11 wherein the ions comprise B or $BF_2$ ions, wherein implanting the ions comprises implanting the ions to a depth in a range between about 1000 Ångstroms and about 2000 Ångstroms into the first active area and a dose in a range between about $10^{12}$ ions/cm$^2$ to about $4\times10^{13}$ ions/cm$^2$.

13. A method according to claim 11 wherein the ions comprise As or P ions, wherein implanting the ions comprises implanting the ions to a depth in a range between about 1000 Ångstroms and about 2000 Ångstroms into the first active area and a dose in a range between about $10^{12}$ ions/cm$^2$ to about $4\times10^{13}$ ions/cm$^2$.

14. A method according to claim 11 wherein etching back the side wall of the mask comprises isotropically etching the side wall of the mask from the edge of the recess.

15. A method according to claim 11 wherein etching the oxide layer to a level comprises etching the oxide layer to a level above the substrate in a range between about 100 Ångstroms and about 500 Ångstroms.

16. A method according to claim 11 further comprising:

forming a buffer oxide layer on the exposed shielded portion prior to implanting ions of the conductivity type into the exposed shielded portion to provide the second active area.

17. A method according to claim 16 wherein forming the buffer oxide layer comprises form the buffer oxide layer to a thickness in a range between about 20 Ångstroms and about 200 Ångstroms.

18. A method of forming an integrated circuit comprising:

forming an oxide layer to fill a recess in a substrate and on an exposed surface of the substrate adjacent to a mask thereon;

implanting ions of a conductivity type through the oxide layer into the substrate adjacent to an edge of the recess to provide a first active area of the substrate having a first concentration of the ions, wherein the ions are blocked from implantation into a shielded portion of the substrate beneath the mask; and implanting ions of the conductivity type into the exposed shielded portion to provide a second active area of the substrate having a second concentration of the ions and into the substrate adjacent to the edge of the recess to increase the first concentration to a third concentration of the ions that is greater than the second concentration.

* * * * *